United States Patent
Usui et al.

[11] Patent Number: 6,136,478
[45] Date of Patent: Oct. 24, 2000

[54] MASK PATTERN CORRECTION METHOD AND EXPOSURE MASK TO BE USED FOR SUCH A METHOD

[75] Inventors: Satoshi Usui; Koji Hashimoto, both of Yokohama, Japan

[73] Assignee: Kabushiki Kaisha Toshiba, Kawasaki, Japan

[21] Appl. No.: 09/137,684

[22] Filed: Aug. 21, 1998

[30] Foreign Application Priority Data

Aug. 22, 1997 [JP] Japan .................................... 9-226679

[51] Int. Cl.$^7$ ...................................................... G03F 9/00
[52] U.S. Cl. ................... 430/5; 430/30; 430/313
[58] Field of Search ............................. 430/30, 296, 313, 430/5

[56] References Cited

U.S. PATENT DOCUMENTS

| | | | |
|---|---|---|---|
| 5,432,714 | 7/1995 | Chung et al. | 430/30 |
| 5,667,923 | 9/1997 | Kanata | 430/30 |
| 5,736,281 | 4/1998 | Watson | 430/30 |
| 5,821,014 | 10/1998 | Chen et al. | 430/90 |
| 5,858,591 | 1/1999 | Lin et al. | 430/30 |
| 5,871,874 | 2/1999 | Tounai | 430/30 |
| 5,895,736 | 4/1999 | Nakajima | 430/30 |

OTHER PUBLICATIONS

Liebmann et al.; "Optical Proximity Correction, a First Look at Manufacturability" SPIE, vol. 2322, Photomask Technology and Management (1994), pp. 229–237.

*Primary Examiner*—Christopher G. Young
*Attorney, Agent, or Firm*—Finnegan, Henderson, Farabow, Garrett & Dunner, L.L.P.

[57] ABSTRACT

With a mask pattern correction method, a mask correction rule is prepared by taking the correlation of the dimensional variation in the wafer and the amount of correction so that identical devices may be manufactured by a plurality of different manufacturing apparatus. Finished wafers are electrically measured for the dimensional variation of the pattern and the dependency on the distance to the nearest neighbor with an ACLV after the entire process to determine the dimensional variation per edge of the pattern on the wafer. A correction factor is determined from the correlation of the designed dimensions and the actual dimensions of the finished products under constant pattern pitch condition. Then, the dependencies on the distance to the nearest neighbor are made to agree with each other and the dimensional variation per edge is divided by the correction factor. The obtained result is sorted by the minimum grid with of the mask writing system to determine the x-coordinate of each of the points on the grid of the mask writing system. Then, the correction region for 1 grid, the correction region for 2 grids and so on are determined on the basis of the x-coordinate values.

16 Claims, 12 Drawing Sheets

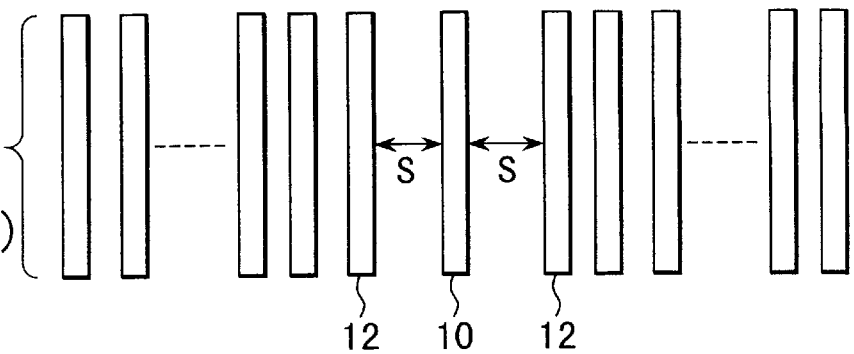
FIG. 1 (PRIOR ART)
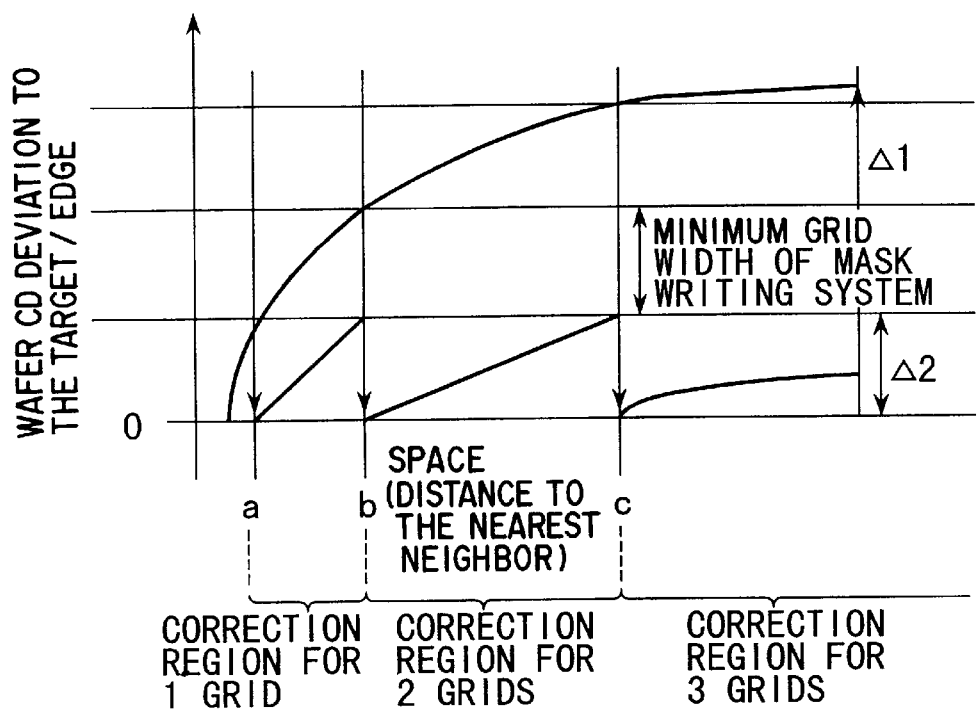
FIG. 2 (PRIOR ART)
FIG. 3 (PRIOR ART)
| SPACE | CORRECTION VALUE/EDGE |
|---|---|
| S ≦ a | 0 |
| a < S ≦ b | −1 GRID |
| b < S ≦ c | −2 GRID |
| S > c | −3 GRID |

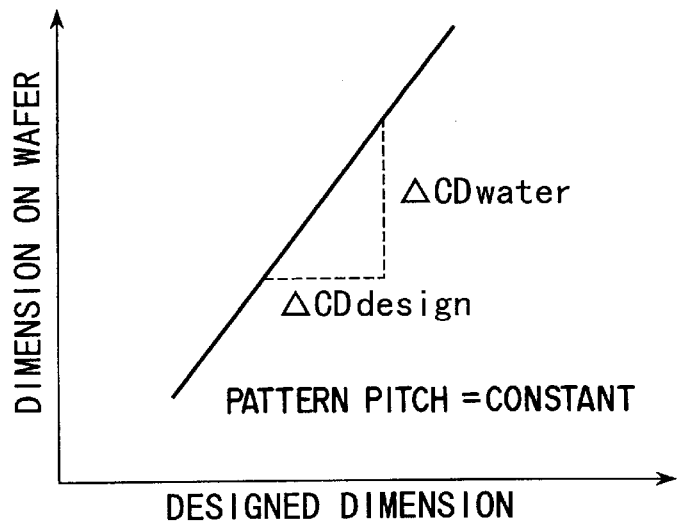
FIG. 7
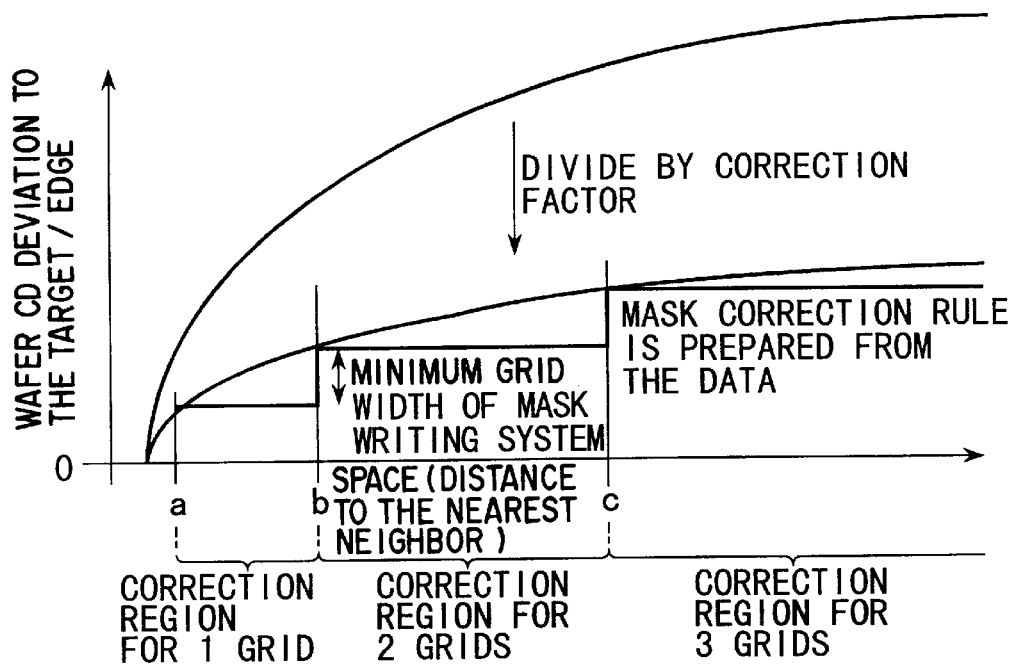
FIG. 8
| SPACE | CORRECTION VALUE/EDGE |
|---|---|
| S ≦ a | 0 |
| a < S ≦ b | -1 GRID |
| b < S ≦ c | -2 GRID |
| S > c | -3 GRID |
FIG. 9

| SPACE | CORRECTION VALUE/EDGE |
|---|---|
| $S \leq a'$ | 0 |
| $a' < S \leq b'$ | −1 GRID |
| $b' < S \leq c'$ | −2 GRID |
| $S > c'$ | −3 GRID |

OPC RULE TABLE FOR CD ≦ (A+B)/2 μm

FIG. 18A

| SPACE | CORRECTION VALUE/EDGE |
|---|---|
| S ≦ a | 0 |
| a < S ≦ b | −1 GRID |
| b < S ≦ c | −2 GRID |
| c < S ≦ d | −3 GRID |
| d < S ≦ e | −4 GRID |
| e < S | −5 GRID |

OPC RULE TABLE FOR (A+B)/2 < CD ≦ (B+C)/2 μm

FIG. 18B

| SPACE | CORRECTION VALUE/EDGE |
|---|---|
| S ≦ a | 0 |
| a < S ≦ b' | −1 GRID |
| b' < S ≦ c' | −2 GRID |
| c' < S | −3 GRID |

OPC RULE TABLE FOR CD > (B+C)/2 μm

FIG. 18C

| SPACE | CORRECTION VALUE/EDGE |
|---|---|
| S ≦ a | 0 |
| a < S ≦ b" | −1 GRID |
| b" < S | −2 GRID |

| SPACE | CORRECTION VALUE/EDGE |
|---|---|
| S≦a | 0 |
| a<S≦b | −1 GRID |
| b<S≦c | −2 GRID |
| c<S≦d | −3 GRID |
| d<S≦e | −4 GRID |
| e<S | −5 GRID |

MASK PATTERN CORRECTION METHOD AND EXPOSURE MASK TO BE USED FOR SUCH A METHOD

BACKGROUND OF THE INVENTION

This invention relates to a mask pattern correction method applicable to a mask to be used in the lithography process of manufacturing semiconductor devices. It also relates to an exposure mask to be used for such a method.

The upward trend of integration and operating speed of semiconductor devices in recent years has entailed ever more rigorous requirements to be met for dimensionally controlling device patterns in the manufacture of semiconductor devices. Additionally, the problem of OPE (optical proximity effect) attributable to the manufacturing process has become remarkable as a result of down-sizing of devices.

In the manufacture of semiconductor devices, the conditions of the manufacturing process are tuned so as to make the areas with the least process margin show intended (designed) dimensions. Those areas are where their dimensions have to be selected very carefully and, in the case of a semiconductor memory, they may refer to the memory cells where the pattern elements show the highest density. However, if the conditions of the manufacturing process are adapted to the memory cells where the pattern elements shows the highest density, the peripheral circuits where the pattern elements are not very densely arranged can be affected by the optical proximity effect (OPE) attributable to the manufacturing process to show discrepancies between the designed dimensions and the actual dimensions. The optical proximity effect is in fact a phenomenon given rise to by a number of factors including the optical image of the pattern obtained after passing through an exposure mask, the latent image existing in the resist, the process of applying resist and developing the latent image, the make of the backing film, the make of the etching of the backing film, the postprocessing such as cleaning and oxidation and the process of preparing the exposure mask, which may affect each other to make the phenomenon a very complicated one.

Thus, the optical proximity effect is attributable not only to optical factors and a number of research laboratories have been paying efforts in the development of technologies on optical proximity correction (OPC). According to many of the published research papers on OPC, most OPC technologies are based on simulated optical images.

However, as pointed out above, there are a number of non-optical factors that are responsible for the OPE in the mask wafer process and, therefore, the OPE of the overall process on wafers has to be looked into in order to properly correct the dimensions of the masks used in the process.

Known techniques for correcting one-dimensional gate patterns realized by taking the overall mask wafer process into consideration include the buckets method (L. Liebman et al., SPIE, Vol. 2322, Photomask Technology and Management (1994), 229). The buckets method will be briefly discussed hereinafter by referring to FIGS. 1 through 3.

With the buckets method, a TEG (test element group) of finished wafers having measured sizes with an ACLV (across the chip linewidth variation) is used after the mask wafer process to electrically determine the relationship between the dimensional variation (difference between the designed size and the produced size) and the distance between the pattern under observation 10 and each of the directly adjacent patterns 12 (dependency on the distance to the nearest neighbor) (see FIG. 1).

Then, the dimensional variation per edge is determined on each wafer by using characteristic data as shown in FIG. 2. Then, the points that are electrically located on the grid of the mask writing system are picked up by dividing the obtained result by the smallest grid width (on the wafer) of the mask writing system, referring to a "0" variation point from the intended size. Subsequently, a correction region for 1 grid, a correction region for 2 grids and so on are determined by means of the x-coordinate values (a, b, c, . . . ) of the picked up points to prepare a mask correction rule as shown in FIG. 3.

With this technique, the dimensional difference per edge due to the variation in the pattern density can be theoretically reduced from $\Delta 1$ to $\Delta 2$.

However, the buckets method proposed by L. W. Liebman et al. for correcting a gate pattern is accompanied by the problems as will be discussed below by referring to FIGS. 4 and 5.

Problem 1

Referring to FIG. 4, as for a dimensional correction of a device, firstly, a pattern of the device is designed with predetermined dimensions in design process S1. After passing through mask process S2 and lithography process S3, an actual pattern is prepared in etching process S4. Then, the dimensions of the pattern are electrically determined in measurement process S5 and a finished pattern is produced in on-wafer dimensions finalizing process S6.

With the known buckets correction method of L. W. Liebman et al., the mask correction rule is determined by assuming that the correlation (correction factor) between the dimensional variation of wafer and the amount of correction in process S6 is expressed by a linear function with a coefficient of "1". This means that, if a dimension on the wafer is greater than the corresponding dimension of the pattern by 50 nm, the dimension of the pattern is reduced by 50 nm.

However, as pointed out above, the OPE is affected by various factors (including the mask process, the lithography process, the etching process and so on in FIG. 4) and hence the processes in FIG. 4 do not necessarily show a linear relationship with a coefficient of "1". For example, in the lithography process 3, the coefficient will become greater than "1" and the linear relationship will no longer be held as the size of the pattern is reduced (as in the area left to the vertical broken line in FIG. 5).

A coefficient exceeding "1" refers to a state where a dimension on the wafer is greater than the corresponding dimension of the pattern by more than 50 nm but the dimension of the pattern will become too small if it is reduced by 50 nm by applying the known buckets correction method of L. W. Liebman et al. Thus, the known buckets correction method cannot be used to accurately correct the dimensions of a mask.

Problem 2

With the known buckets correction method of L. W. Liebman et al., the dimensional difference per edge between the finished pattern and the intended pattern is determined by the grid width of the mask writing system and equal to $\Delta 2$ as shown in FIG. 2. The difference should be reduced further.

Problem 3

When the known buckets correction method is applied to mass production, there arises the following problem.

Generally, same devices may be manufactured in more than one factories or on more than one production lines. If they are manufactured on a same single line, more than manufacturing apparatus may be used for them. As a matter of course, the pattern density dependency of the dimensions of the patterns on the finished wafers may vary from factory to factory, from line to line and/or from apparatus to apparatus. If the pattern density dependency of the patterns on the finished wafers varies, the correction rule is changed so that different correction masks will be necessary for the different factories, the different production lines and/or the different manufacturing apparatus.

However, the use of different correction masks among different factories, different production lines and/or different manufacturing apparatus for manufacturing same devices will be cumbersome from the viewpoint of preparing and controlling masks and inefficient in terms of manufacturing devices. Thus, there is a demand for a correction method with which a same correction mask can be used among different factories, different production lines and/or different manufacturing apparatus for manufacturing same devices.

BRIEF SUMMARY OF THE INVENTION

Therefore, the object of the present invention is to provide a mask pattern correction method with which a same correction mask can be used among different factories, different production lines and/or different manufacturing apparatus for manufacturing same devices and also an exposure mask to be used for such a correction method.

According to a first aspect of the invention, there is provided a mask pattern correction method comprising:

the first process of determining the correlation coefficient of the pattern dimensions on a semiconductor wafer and the designed pattern dimensions; and the second process of correcting the mask pattern on the basis of the correlation coefficient determined by the first process.

According to the invention, there is also provided a mask pattern correction method comprising:

the first process of determining the correlation coefficient of the first pattern dimensions of a semiconductor wafer and the designed pattern dimensions;

the second process of determining the dependency of the first pattern dimensions on the distance to the nearest neighbor of the semiconductor wafer;

the third process of obtaining the second pattern dimensions and their dependency on the distance to the nearest neighbor by dividing by the correlation coefficient and that dependency on the distance to the nearest neighbor;

the fourth process of sorting the second pattern dimensions and their dependency on the distance to the nearest neighbor by the mask writing grid width of the mask writing system to be used for preparing a mask by referring to the intended mask pattern dimensions, extracting points on the second pattern dimensions and their dependency appearing on the distance to the nearest neighbor on the mask writing grid and determining the dimensional difference from the pattern proximity and the reference; and the fifth process of conducting a correction by means of the mask writing grid width multiplied by an integer to produce a value closest to the dimensional difference of the pattern and the reference depending on the pattern proximity.

According to the invention, there is also provided a mask pattern correction method comprising:

the first process of determining the correlation coefficient of the first pattern dimensions of a semiconductor wafer and the designed pattern dimensions;

the second process of determining the dependency of the first pattern dimensions on the distance to the nearest neighbor of the semiconductor wafer;

the third process of obtaining the second pattern dimensions and their dependency on the distance to the nearest neighbor by dividing by the correlation coefficient and that dependency on the distance to the nearest neighbor;

the fourth process of sorting the second pattern dimensions and their dependency on the distance to the nearest neighbor by the mask writing grid width of the mask writing system to be used for preparing a mask by referring to the intended mask pattern dimensions, extracting points on the second pattern dimensions and their dependency on the distance to the nearest neighbor appearing on the mask writing grid and determining the dimensional difference from the pattern proximity and the reference; and the fifth process of conducting a correction by means of the mask writing grid width multiplied by an integer to produce a value closest to the dimensional difference of the pattern and the reference depending on the pattern proximity; wherein the masks to be used in different factories, production lines and/or manufacturing apparatus are corrected with a same correlation table in case the largest dimensional difference for one pattern width in the distance to the nearest neighbor among a plurality of factories, production lines and/or manufacturing apparatus is less than 2×the minimum mask writing grid width of the mask writing system×the correlation coefficient.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic illustration showing a TEG (test element group) of finished wafers having measured sizes with an ACLV (across the chip linewidth variation).

FIG. 2 is a graph showing the electric characteristic of an ACLV to be corrected by the known buckets correction method of L. W. Liebman et al.

FIG. 3 is a chart illustrating a mask correction rule using the known buckets correction method of L. W. Liebman et al.

FIG. 7 is a graph illustrating the first embodiment of mask pattern correction method according to the invention particularly in terms of determining the correction factor.

FIG. 8 is a graph showing the electric characteristic of an ACLV to be corrected by the first embodiment of mask pattern correction method according to the invention.

FIG. 9 is a chart illustrating a mask correction rule using the first embodiment of mask pattern correction method according to the invention.

FIG. 18A is chart illustrating mask correction rules using the fourth embodiment of mask pattern correction method according to the invention.

FIG. 18B is chart illustrating mask correction rules using the fourth embodiment of mask pattern correction method according to the invention.

FIG. 18C is chart illustrating mask correction rules using the fourth embodiment of mask pattern correction method according to the invention.

DETAILED DESCRIPTION OF THE INVENTION

Now, the present invention will be described by referring to the accompanying drawing that illustrates preferred embodiments of the invention.

Figure 6:
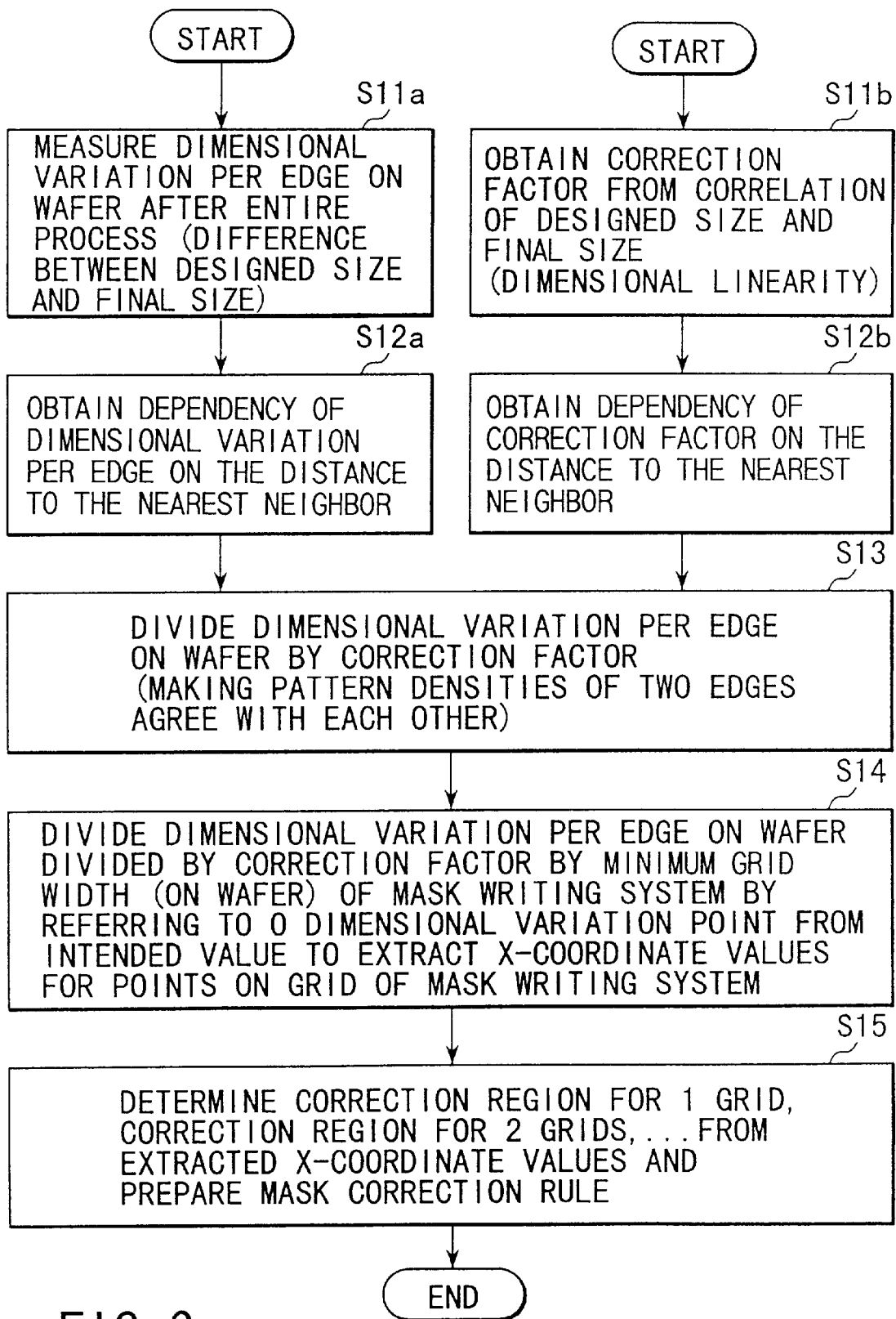
FIG. 6 is a schematic flow chart illustrating a first embodiment of mask pattern correction method according to the invention.

FIGS. 6 through 8 illustrate a first embodiment of mask pattern correction method according to the invention. The first embodiment will be described particularly in terms of a method of preparing a mask correction rule by taking the correlation between the designed dimensions and those of the finished mask.

Figure 4:
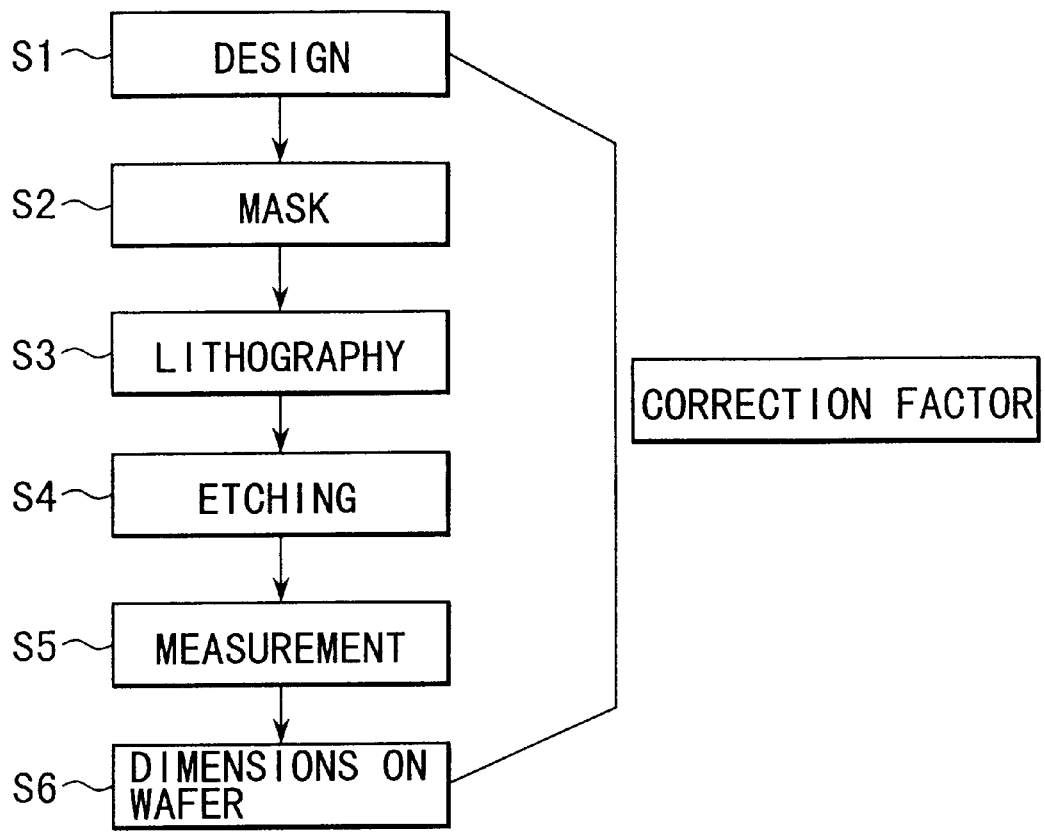
FIG. 4 is a schematic flow chart illustrating the pattern correction processes and the correction factor.
Figure 5:
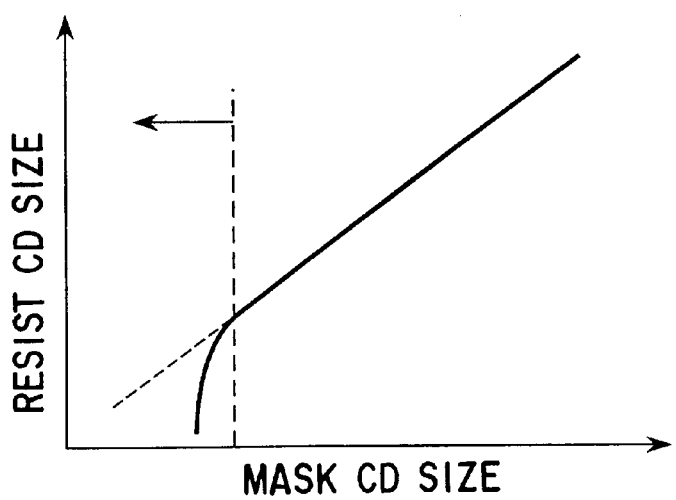
FIG. 5 is a graph showing the linear relationship between the resist size and the mask size in a lithography process.

Assume that the flow chart of FIG. 4 is used for manufacturing semiconductor devices. More specifically, a pattern of the device is designed with predetermined dimensions in design process S1. After passing through mask process S2 and lithography process S3, an actual pattern is prepared in etching process S4. Then, the dimensions of the pattern are electrically determined in measurement process S5 and a finished pattern is produced in on-wafer dimensions finalizing process S6.

Referring now to the flow chart of FIG. 6, in Step S11$a$, a TEG (test element group) of finished wafers having measured sizes with an ACLV (across the chip linewidth variation) is used after the entire process to electrically determine the relationship between the dimensional variation (difference between the designed size and the produced size) and the distance between the pattern under observation and each of the directly adjacent patterns (dependency on the distance to the nearest neighbor). Then, in Step S12$a$, the dimensional variation per edge is determined on each wafer.

Meanwhile, in Step S11$b$, a correction factor is obtained from correlation of the designed dimensions and the dimensions of the finished pattern (on the wafer). The correction factor of a mask pattern correction method according to the invention is defined by the equation below.

$$\text{correction factor} = \Delta CD_{wafer} / \Delta CD_{design}$$

where CD (critical dimension) refers to the size of the mask pattern. The pattern to be measured and each of the adjacently located patterns are arranged at an invariable pitch.

Once the correction factor is obtained, the pattern density dependency of the correction factor can be obtained in Step S12$b$.

Then, in Step S13, the dimensional variation per edge obtained in Steps S11$a$ and 12$a$ is divided by the correction factor obtained in Steps S11$b$ and 12$b$. The pattern density dependencies of the two edges are made to agree with each other.

Then, in Step S14, the obtained result is divided by the smallest grid width (on the wafer) of the mask writing system as in the case of the buckets correction method of L. W. Liebman et al. More specifically, the dimensional variation per edge obtained (on the wafer) in Step S13 is divided by the smallest grid width of the mask writing system by referring to a point that show a dimensional variation of "0" from the intended value. Thus, the x-coordinate values of the points located on the grid of the mask writing system will be obtained.

Then, in Step S15, a correction region for 1 grid, a correction region for 2 grids and so on are determined by means of the x-coordinate values of the picked up points to prepare a mask correction rule as shown in FIG. 9. Note that the span between a and b represents a correction region for 1 grid and the span between b and c on the x-coordinate represents a correction region for 2 grids on the x-coordinate while the span after c on the x-coordinate represents a correction region for 3 grids.

In this way, the mask can be corrected highly accurately by taking the correlation between the dimensional variation of the pattern size on the wafer and the corrected values.

Figure 10:
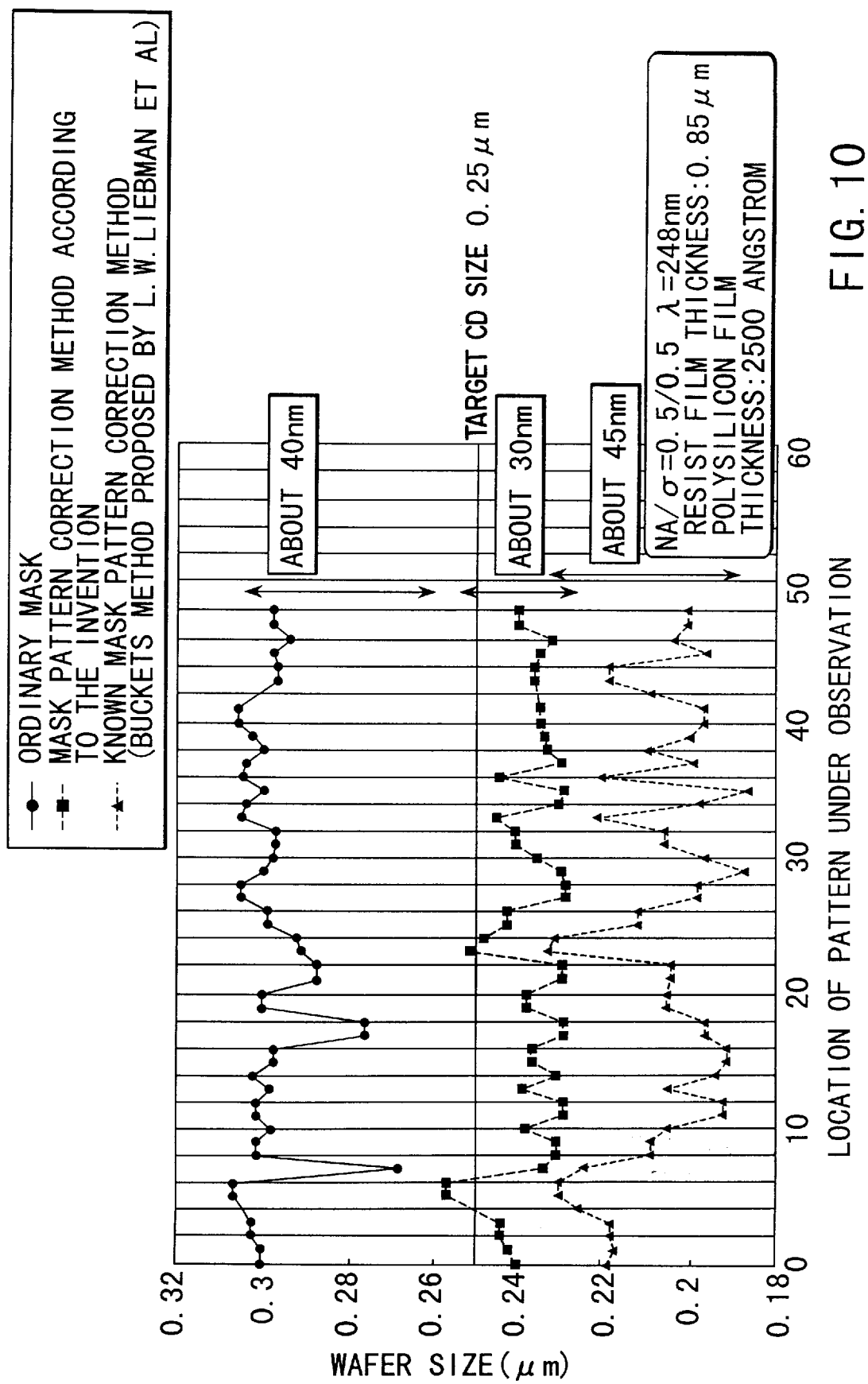
FIG. 10 is a graph showing the actually measured sizes of the gate layers of logic devices obtained by using an ordinary mask, those corrected by the known mask pattern correction method of L. W. Liebman et al. and those corrected by the first embodiment of mask pattern correction method according to the invention.

FIG. 10 is a graph showing the actually measured sizes of the gate layers of logic devices obtained by using an ordinary mask, those corrected by the known mask pattern correction method (the buckets correction method of L. W. Liebman et al.) and those corrected by the first embodiment of mask pattern correction method according to the invention. In FIG. 10, the numbers on the horizontal axis represents the gate layers of logic devices, where the actual pattern having various values for the pattern proximity and the density were measured.

From FIG. 10, it will be seen that the largest dimensional variation from the intended dimension (250 nm) is about 60 nm and the dimensional dispersion of the actual pattern is about 40 nm in the case of an ordinary mask, whereas the corresponding values are reduced to about 20 nm and about 30 nm respectively when corrected by the first embodiment of mask pattern correction method according to the invention.

On the other hand, however, when corrected by the buckets correction method of L. W. Liebman et al., the corresponding values are about 60 nm and about 45 nm to evidence that no remarkably correction effect can be obtained.

Thus, it is clear that the first embodiment of mask pattern correction method according to the invention is by far more effective than the buckets correction method of L. W. Liebman et al. in terms of reducing both the largest dimensional variation from the intended dimension and the dimensional dispersion of the actual pattern. It will be needless to say that the first embodiment of mask pattern correction method is applicable to other layers of logic devices and memory devices.

Now, a second embodiment of the invention will be described below.

Figure 11:
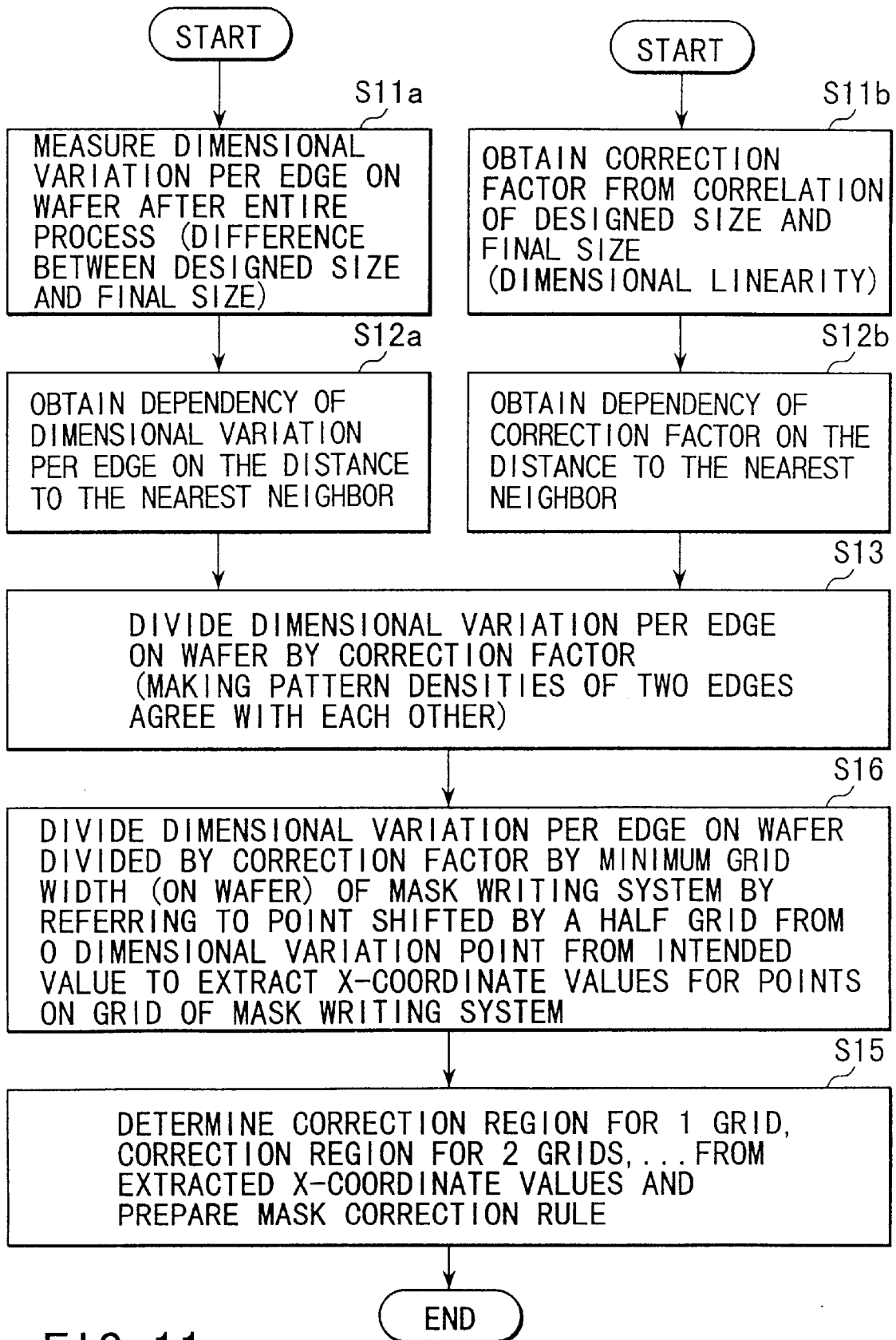
FIG. 11 is a schematic flow chart illustrating a second embodiment of mask pattern correction method according to the invention.
Figures 12, 13:
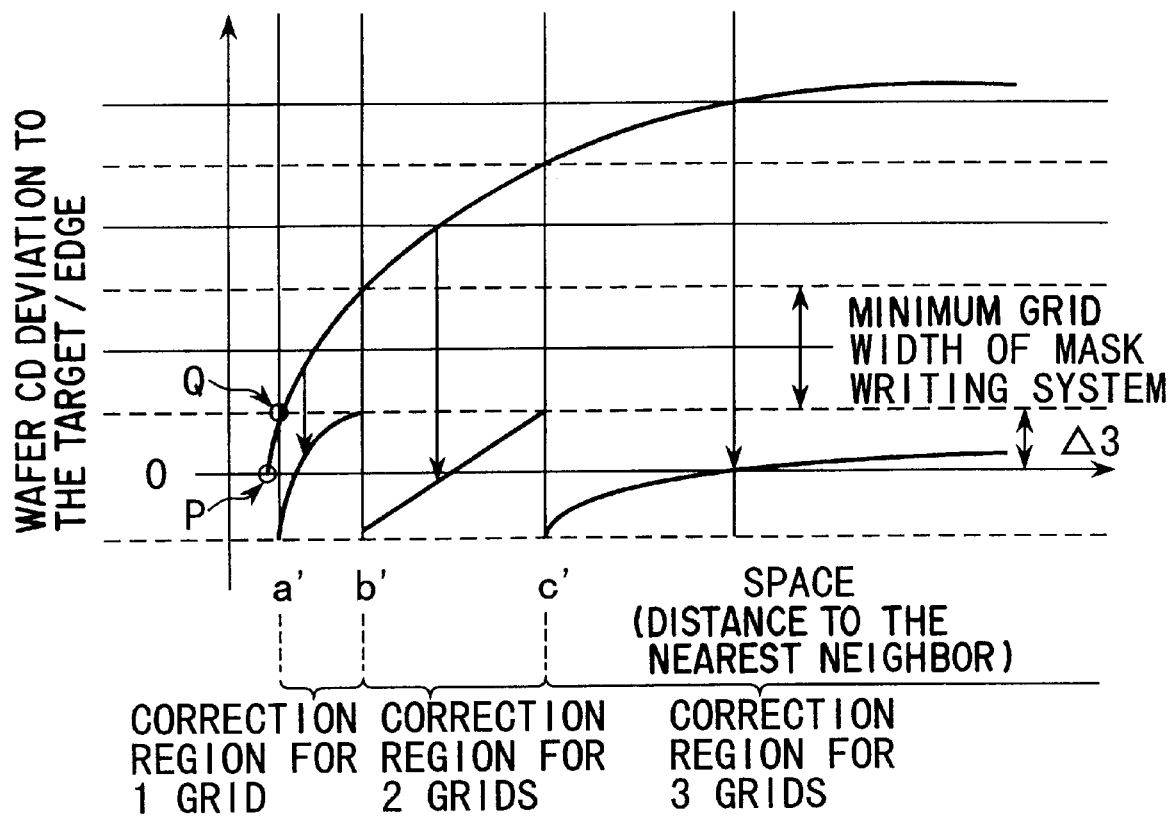
FIG. 12 is a graph showing the electric characteristic of an ACLV to be corrected by the second embodiment of mask pattern correction method according to the invention.
FIG. 13 is a chart illustrating a mask correction rule using the second embodiment of mask pattern correction method according to the invention.

FIG. 11 is a schematic flow chart illustrating a second embodiment of mask pattern correction method according to the invention. FIG. 12 is a graph showing the electric characteristic of an ACLV to be corrected by the second embodiment of mask pattern correction method according to the invention.

Steps S11a, S12a, S11b, S12b and S13 in the flow chart of FIG. 11 are same as their counterparts of the above described first embodiment and hence will not be described here any further.

While a point with zero dimensional variation from the intended size as measured in Step S13 is used as reference point in the first embodiment, a point (indicated by Q in FIG. 12) shifted by a half grid from a point (indicated by P in FIG. 12) with zero dimensional variation from the intended size as measured in Step S16 is used as reference point in this embodiment. Then, the points that are electrically located on the grid of the mask writing system are picked up by dividing the obtained result by the smallest grid width (on the wafer) of the mask writing system. Subsequently, in Step S15, a correction region for 1 grid, a correction region for 2 grids and so on are determined by means of the x-coordinate values of the picked up points to prepare a mask correction rule as shown in FIG. 13.

FIG. 13 is a chart illustrating a mask correction rule using the second embodiment of mask pattern correction method according to the invention.

A correction region for 1 grid, a correction region for 2 grids and so on are determined according to the relationship of the distances between the pattern under observation and the directly adjacent patterns and the x-coordinate values (a', b', c', . . . ) of the picked up points.

With this technique of using the mask correction rule of this embodiment, the dimensional difference from the intended size per edge due to the variation in the pattern density is equal to Δ3 at most or a half of the dimensional difference from the intended size obtained by the buckets correction method of L. W. Liebman et al. (see FIG. 12).

If this embodiment of mask pattern correction method is combined with the first embodiment, the dimensional difference from the intended size per edge due to the variation in the pattern density on a wafer is reduced to the difference per grid×correction factor.

Now, a third embodiment of the invention will be described below.

Figure 14:
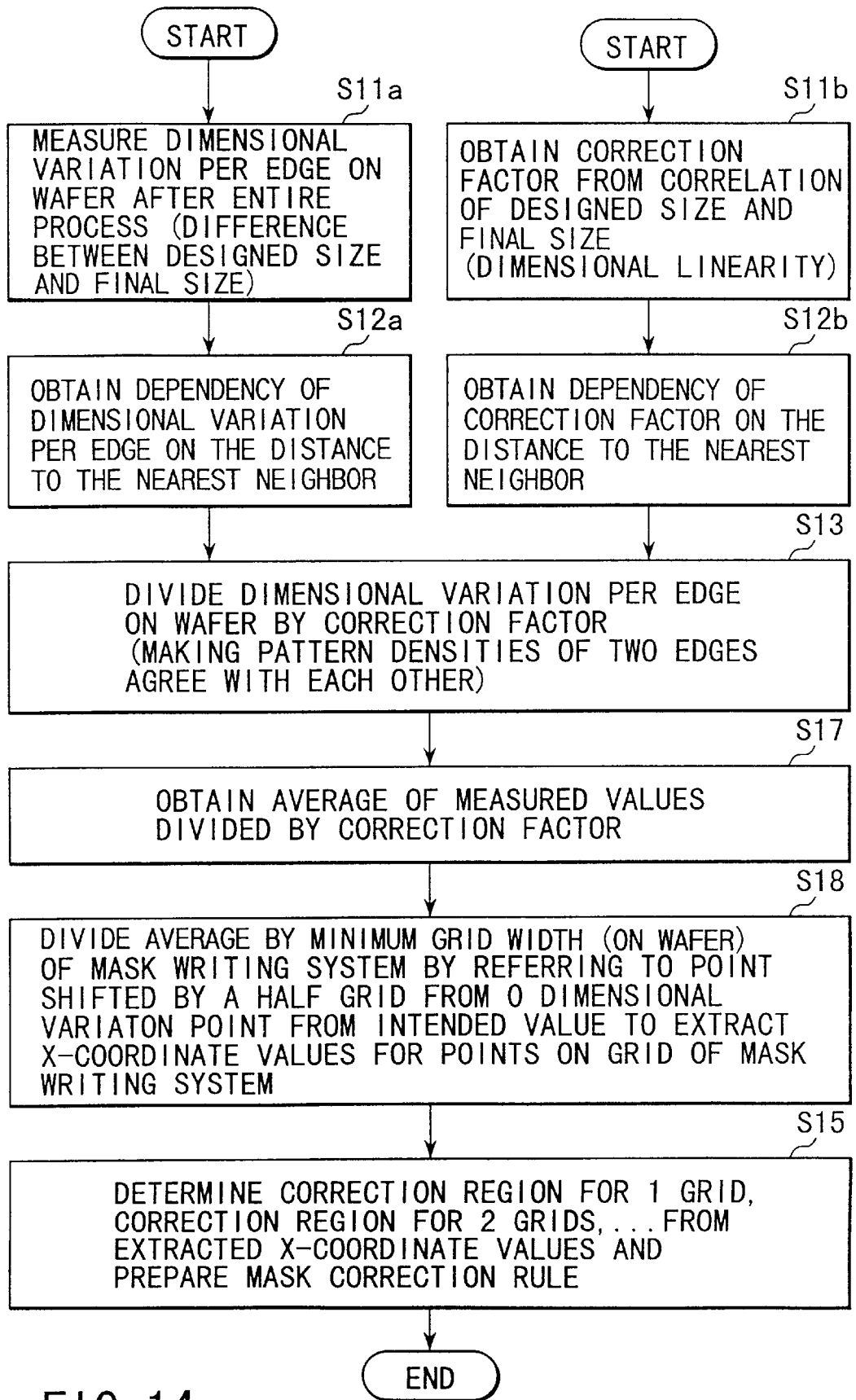
FIG. 14 is a schematic flow chart illustrating a third embodiment of a mask pattern correction method according to the invention.
Figure 15:
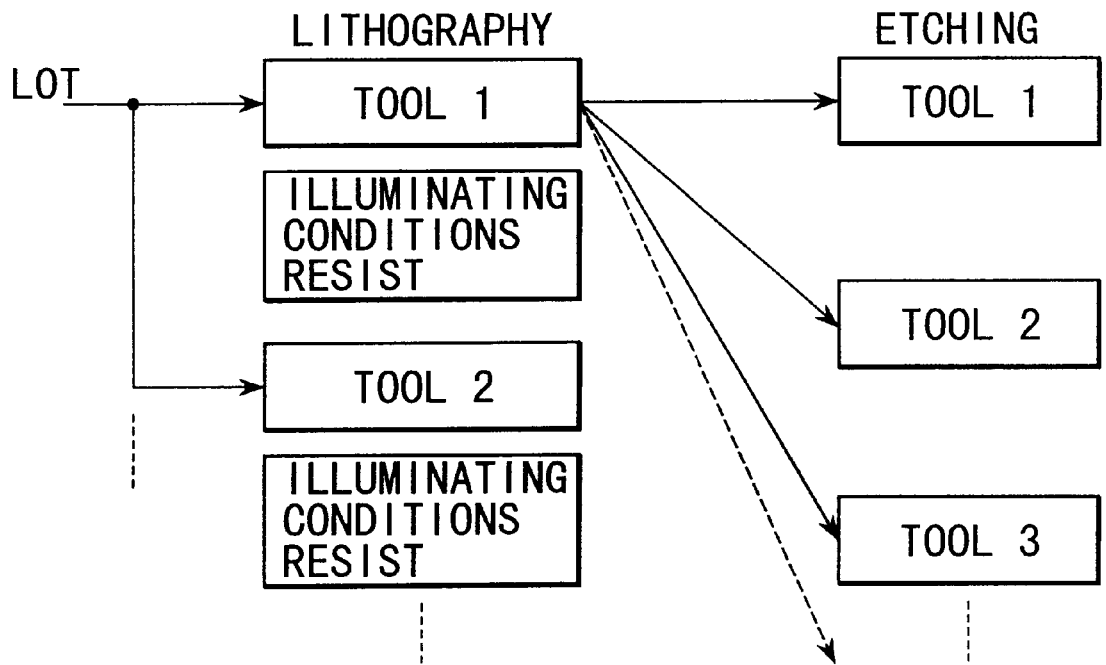
FIG. 15 is a schematic block diagram of a semiconductor device manufacturing line.
Figure 16:
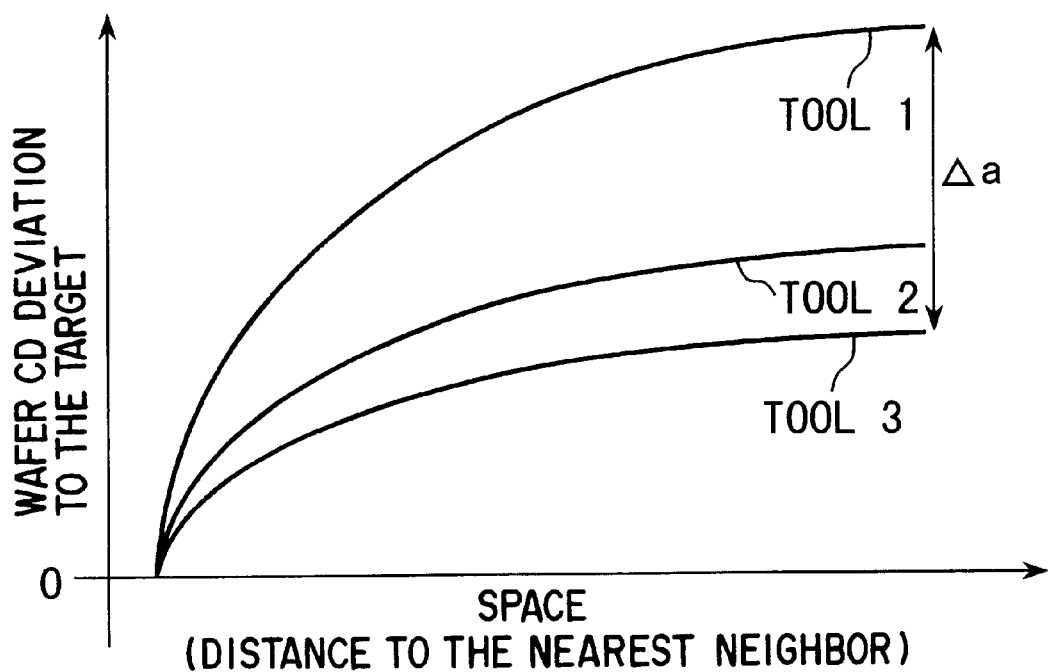
FIG. 16 is a graph showing the electric characteristics of ACLVs to be corrected by a mask pattern correction method according to the invention.

FIG. 14 is a schematic flow chart illustrating a third embodiment of a mask pattern correction method according to the invention. FIG. 15 is a schematic block diagram of a semiconductor device manufacturing line. FIG. 16 is a graph showing the electric characteristics of ACLVs to be corrected by the third embodiment of mask pattern correction method according to the invention.

Assume that same devices are manufactured on a manufacturing line as illustrated in FIG. 15. A plurality of different tools will typically be used in the lithography process and the etching process. A TEG (test element group) of finished wafers having measured sizes with an ACLV (across the chip linewidth variation) is used for each manufacturing apparatus after the entire process to electrically determine the relationship between the dimensional variation (difference between the designed size and the produced size) and the distance between the pattern under observation and each of the directly adjacent patterns (dependency on the distance to the nearest neighbor) (see FIG. 1). Then, as shown in FIG. 16, the dimensional variation is determined on each wafer. Thereafter, the dimensional variation obtained for each manufacturing apparatus is divided by the correction factor obtained for each dependency on the distance to the nearest neighbor.

In other words, the processing operations of Steps S11a, S12a, S11b, S12b and S13 shown in FIG. 14 are carried out for each manufacturing apparatus.

Then, in Step S17, the results obtained by dividing by the respective correction factors are averaged. In Step S18, the average value is used in this embodiment as reference point shifted by a half grid from a point with zero dimensional variation from the intended size. Thus, the points that are electrically located on the grid of the mask writing system are picked up by dividing the obtained result by the smallest grid width (on the wafer) of the mask writing system.

Subsequently, in Step S15, a correction region for 1 grid, a correction region for 2 grids and so on are determined by means of the x-coordinate values of the picked up points to prepare a mask correction rule.

Assume here that, if the largest dimensional difference Δa due to the dependency on the distance to the nearest neighbor is controlled to be less than 2×the smallest mask writing grid width of the mask writing system×said correlation coefficient among different factories, production lines and/or manufacturing apparatus as shown in FIG. 16, then the largest corrected width is same for all the factories, production lines and/or manufacturing apparatus so that masks corrected in a same way may be used for all the factories, production lines and/or manufacturing apparatus.

In other words, if the largest dimensional difference Δa due to the dependency is less than 2×the smallest mask writing grid width of the mask writing system×said correlation coefficient among different factories, production lines and/or manufacturing apparatus, masks corrected in a same way will be used, whereas masks corrected differently will have to be used if the largest dimensional difference Δa due to the dependency is less than 2×the smallest mask writing grid width of the mask writing system×said correlation coefficient among different factories, production lines and/or manufacturing apparatus.

While the process (Step S11a) of measuring the dimensional variation per edge and that (Step S12a) of determining the dependency on the distance to the nearest neighbor of the dimensional different are conducted concurrently with the process (Step S11b) of obtaining a correction factor and that (Step S12b) of determining the dependency on the distance to the nearest neighbor of the correction factor in the above described first through third embodiments, the present invention is not limited thereto. For example, Steps S11b and S12b may be conducted after Steps S11a and S12a.

Now, a fourth embodiment of the invention will be described.

While a single pattern width, e.g. 0.25 μm, is used in each of the above described first through third embodiments, patterns having different widths may be designed in actual applications.

Figure 17:
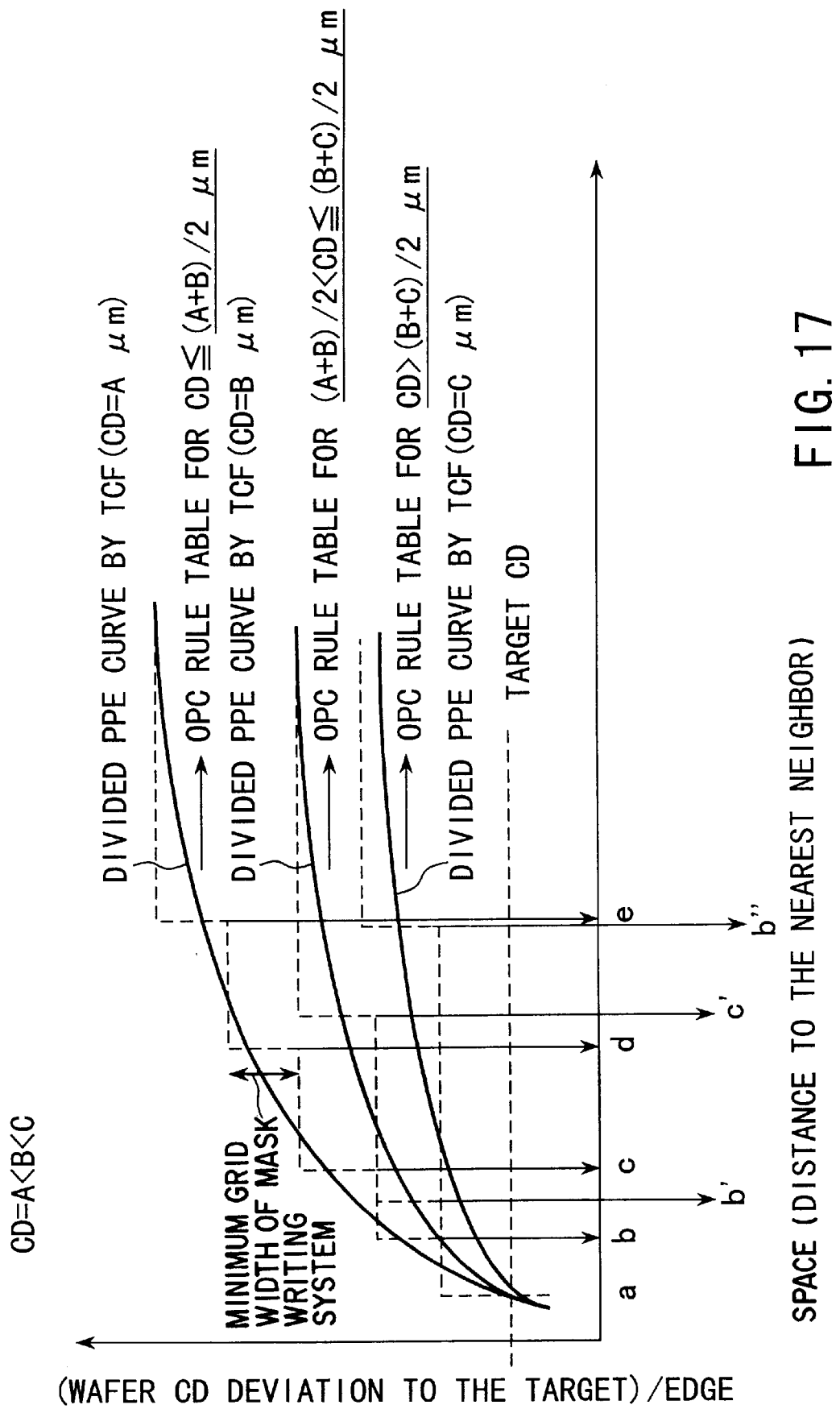
FIG. 17 is a graph showing the electric characteristic of an ACLV to be corrected by a fourth embodiment of mask pattern correction method according to the invention.

FIG. 17 is a graph showing the electric characteristic of an ACLV to be corrected by the fourth embodiment of mask pattern correction method according to the invention.

In this embodiment, mask rules will be prepared for three patterns having different line widths of A, B and C, respectively. Assume that the pattern widths are differentiated to show a relationship of A<B<C.

Then, correction factors are obtained for the respective patterns having width A, B and C as in the case of the first through third embodiments. Once the correction factors are obtained, the dependency on the distance to the nearest neighbor of each of the correction factors is determined. Then, for each of the patterns, the dimensional variation per edge is divided by the corresponding correction factor and the obtained result is divided by the smallest grid width (on the wafer) of the mask writing system. Thus, the x-coordinate values of the points located on the grid of the mask writing system will be obtained. Then, a correction region for 1 grid, a correction region for 2 grids and so on are determined by means of the x-coordinate values of the picked up points to prepare a mask correction rule for each of the three different pattern widths.

Once the mask correction rules are prepared for the pattern widths of A, B and C, similar rules are prepared for a pattern having a width between A and B, a pattern having a width between B and C and a pattern having a width greater than C respectively as shown in FIGS. 18A through 18C.

The correction rule as shown in FIG. 18A will be used if the designed value (CD) of the pattern width is CD≦(A+B)/2. Note that, in FIG. 17, the span between a and b (distance to an adjacent pattern) represents a correction region for 1 grid and the span between b and c represents a correction region for 2 grids on the x-coordinate, while the span between c and d represents a correction region for 3 grids and the space between d and e represents a correction region for 4 grids on the x-coordinate.

The correction rule as shown in FIG. 18B will be used if the designed value (CD) of the pattern width is (A+B)/2<CD≦(B+C)/2. Note that, in FIG. 17, the span between a' and b' (distance to an adjacent pattern) represents a correction region for 1 grid and the span between b' and c' represents a correction region for 2 grids on the x-coordinate while the span after c' on the x-coordinate represents a correction region for 3 grids.

The correction rule as shown in FIG. 18C will be used if the designed value (CD) of the pattern width is CD>(B+C)/2. Note that, in FIG. 17, the span between a" and b" (distance to an adjacent pattern) represents a correction region for 1 grid and the span after b" represents a correction region for 2 grids on the x-coordinate.

Thus, with this embodiment, masks having different widths can be corrected accurately because respective correction rules can be prepared for the masks.

While three mask patterns having different widths are used in the above description, it may be needless to say that the present invention is not limited thereto and applicable to two or more than tree mask patterns having different widths.

Now, a fifth embodiment of the invention will be described.

While the distance between the pattern under observation and each of the directly adjacent patterns is assumed to be constant for all the patterns in the above description of the first through fourth embodiments, the distance can vary in actual applications.

Figures 19, 20:
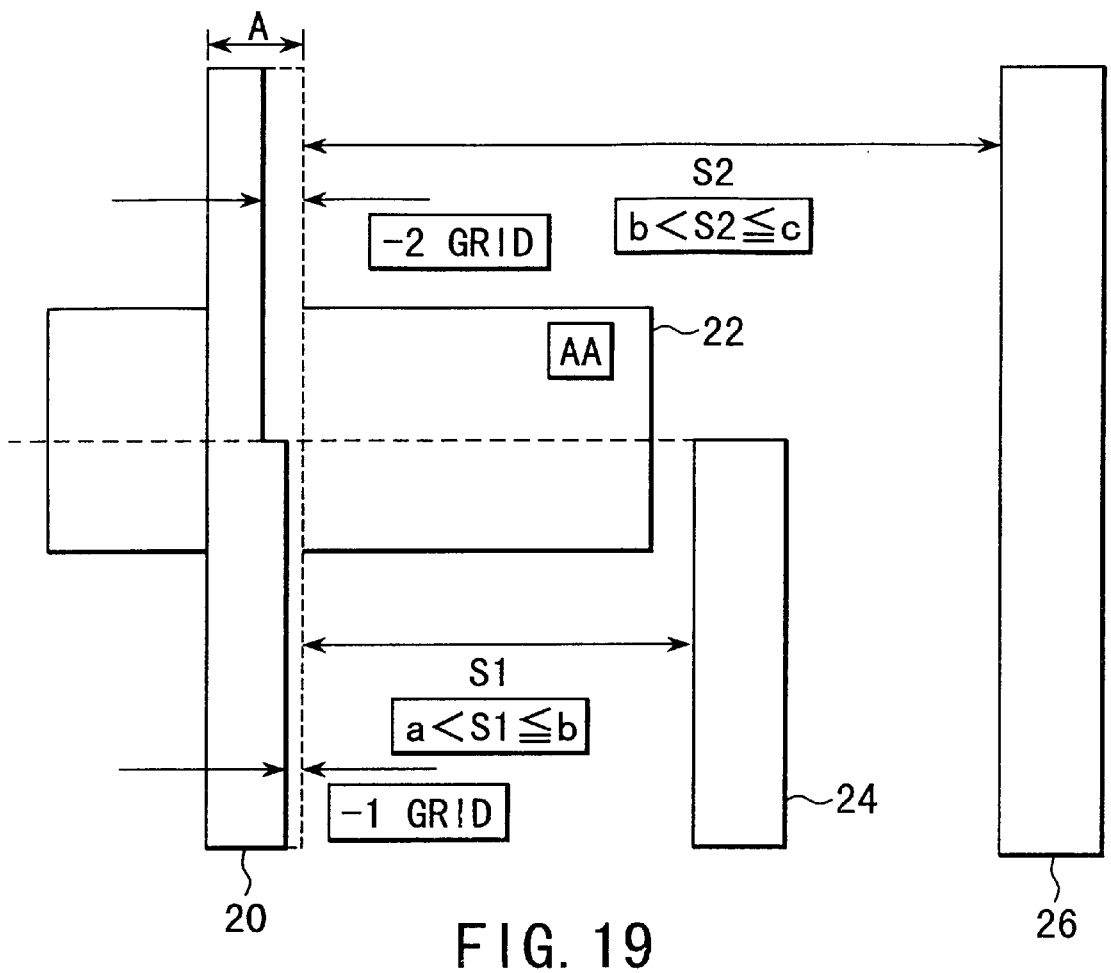
FIG. 19 is a schematic illustration showing a TEG (test element group) of finished wafers having measured sizes as obtained by a fifth embodiment of a mask pattern correction method according to the invention.
FIG. 20 is a chart illustrating a mask correction rule using the fifth embodiment of mask pattern correction method according to the invention.

FIG. 19 is a schematic illustration of such an example, showing the layout a gate region and its vicinity of a transistor. Referring to FIG. 19, there are an adjacent pattern 24 arranged near an active area 22 and separated from the pattern 20 under observation by a distance of S1 and another pattern 26 separated from the pattern 20 by a distance of S2. Note that the adjacent pattern S24 is found only up to the middle of the active area 22 so that the distance between the pattern 20 under observation and an adjacent pattern differs between the area where the pattern 24 is found and the area where the pattern 24 is not found.

In such a case, first, in the same way as the above-mentioned first to third embodiments, the correction factor is obtained for the line width A (measured pattern 20). If the correction factor is obtained, it is possible to obtain a dependency on the distance to the nearest neighbor of the correction factor. Then a dimensional variation per edge is divided by the correction factor and divided with a minimal grid width (over the wafer) of the mask writing system. By doing so, the x coordinate on the grid of the mask writing system is found. The correction region for the 1 grid, correction region for the 2 grids, . . . , are decided based on the thus found x-coordinate. And the correction rules as shown in FIG. 20 are prepared. Assume here that the distances S1 and S2 are defined by a <S1≦b and b<S2≦c. Then, correction rules shown in FIG. 20 will be prepared and used. The span between a and b (distance to an adjacent pattern) represents a correction region for 1 grid and the span between b and c represents a correction region for 2 grids on the x-coordinate, while the span between c and d represents a correction region for 3 grids and the span between d and e represents a correction region for 4 grids on the x-coordinate. The span beyond e represents a correction region for 5 grids on the x-coordinate.

Thus, the correction region is switched from the one for 1 grid to the one for 2 grids for the pattern 24 under observation depending on if the adjacent pattern 24 is findable or not.

Thus, according to the invention, a correction rule can be prepared for a pattern to accurately correct the mask pattern if the distance between it and an adjacent pattern changes.

A sixth embodiment of the present invention will now be explained below. This is a combination of the fourth and fifth embodiment.

Even if the pattern's width differ and the distance between the measured pattern and an adjacent pattern differs in region a corresponding, corresponding correction rules are prepared and, with the use of a jog, it is possible to realize a mask correction of high accuracy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A mask pattern correction method for correcting a pattern, comprising:

a first process of determining a correlation between a variation amount of pattern dimensions of the pattern formed on a semiconductor wafer and a variation amount of designed pattern dimensions of the pattern, where the pattern and an adjacent pattern maintain a specific pitch, said correlation being represented by a correlation coefficient; and a second process of determining a correction amount of correcting the designed pattern dimensions on the basis of the correlation coefficient determined in the first process and thereby correcting the pattern.

2. A mask pattern correction method for correcting a mask pattern, comprising:

a first process of determining a correlation coefficient of a correlation between first pattern dimensions of the pattern formed on a semiconductor wafer and designed pattern dimensions of the pattern, where the pattern and an adjacent pattern maintain a specific pitch;

a second process of determining a first pattern density dependency of the mask pattern on a distance to the nearest neighbor of the semiconductor wafer on the semiconductor wafer;

a third process of obtaining second pattern dimensions and a second pattern density dependency by dividing the first dependency by the correlation coefficient;

a fourth process of dividing the second pattern dimensions and the second pattern density dependency by a mask writing grid width which a mask writing system uses when it prepares a mask by referring to the designed pattern dimensions, and extracting points of the second pattern dimensions and the second pattern density dependency that appear on the mask writing grid, and thereby determining a pattern proximity and a dimensional difference over the designed pattern dimensions; and a fifth process of conducting a correction by use of the mask grid width multiplied by an integer, the mask grid width being the closest to the dimensional difference.

3. A mask pattern correction method according to claim 2, wherein said second pattern dimensions and their dependency on the distance to the nearest neighbor are obtained by dividing by said correlation coefficient and that dependency on the distance to the nearest neighbor corresponding to the related pattern density in said third process.

4. A mask pattern correction method according to claim 3, wherein said second pattern dimensions and their dependency on the distance to the nearest neighbor are corrected by referring to intended values in said fifth process.

5. A mask pattern correction method according to claim 3, wherein said second pattern dimensions and their dependency on the distance to the nearest neighbor are corrected by referring to a value obtained by adding a ½ of said mask writing grid width to intended pattern dimensions in said fifth process.

6. A mask pattern correction method according to claim 4 or 5, wherein said correlation coefficient and said that dependency on the distance to the nearest neighbor are obtained by means of an electric measurement or a scanning electron microscope measurement.

7. A mask pattern correction method according to any of claims 2 through 5, wherein said correlation coefficient is variable and obtained depending on the pattern density.

8. A mask pattern correction method according to claim 4 or 5, wherein a number of correction tables are prepared for that number of different pattern widths and the pattern is corrected according to said number of correction tables depending on the different pattern widths in said fifth process.

9. A mask pattern correction method according to claim 4 or 5, in the case where at least two distances exist between one pattern and the adjacent pattern, at least two correction values are used, under a jog, in accordance with a correction table.

10. A mask pattern correction method according to claim 4 or 5, wherein, in the fifth process, a plurality of correction tables are prepared, for a plurality of different pattern widths, in accordance with the width of the pattern and, in the case where at least two distances exist between said one pattern and the adjacent pattern, at least two correction values are used, under a jog, against said one pattern in accordance with a correction table.

11. A mask pattern correction method for correcting a pattern, comprising:

a first process of determining a correlation coefficient of a correlation between first pattern dimensions of the pattern formed on a semiconductor wafer and designed pattern dimensions of the pattern, where the pattern and an adjacent pattern maintain a specific pitch;

a second process of determining a first pattern density dependency of the mask pattern on a distance to the nearest neighbor of the semiconductor wafer on the semiconductor wafer;

a third process of obtaining second pattern dimensions and a second pattern density dependency by dividing the first dependency by the correlation coefficient;

a fourth process of dividing the second pattern dimensions and the second pattern density dependency by a mask writing grid width which a mask writing system uses when it prepares a mask by referring to the designed pattern dimensions, and extracting points of the second pattern dimensions and the second pattern density dependency that appear on the mask writing grid, and thereby determining a pattern proximity and a dimensional difference over the designed pattern dimensions; and a fifth process of conducting a correction by use of the mask grid width multiplied by an integer, the mask grid width being the closest to the dimensional difference;

wherein the masks to be handled in different factories, production lines and/or manufacturing apparatuses make the same correction in any process in the factories, production lines and/or manufacturing apparatuses when the largest dimensional difference in a pattern density is equal to or smaller than 2×the minimum mask writing grid width of the mask writing system×the correlation coefficient.

12. A mask pattern correction method according to claim 11, wherein the masks to be used in different factories, production lines and/or manufacturing apparatus are corrected width different correction tables, in case the largest dimensional difference for one pattern width in the distance to the nearest neighbor among a plurality of factories, production lines and/or manufacturing apparatus is more than 2×the minimum mask writing grid width of the mask writing system×said correlation coefficient.

13. A mask pattern correction method according to claim 11, wherein said dependency is obtained as the average of the dependency on the distance to the nearest neighbor values different among the plurality of factories, production lines and/or manufacturing apparatus.

14. An exposure mask to be used in a mask pattern correction method according to any one of claims 1–5 or 11–13.

15. A method of manufacturing a semiconductor device, comprising designing a mask to form a mask pattern having specific dimensions on a semiconductor wafer;

preparing the mask as designed, said step of preparing the mask comprising (i) a first process of determining a correlation between a variation amount of pattern dimensions of a pattern formed on a semiconductor wafer and a variation amount of designed pattern dimensions of the pattern, where the pattern and an adjacent pattern maintain a specific pitch, said correlation being represented by a correlation coefficient, and (ii) a second process of determining a correction amount of correcting the designed pattern dimensions on the basis of the correlation coefficient determined in the first process and thereby correcting the pattern;

disposing a resist layer on the semiconductor wafer and forming a pattern by use of the prepared mask;

etching the semiconductor wafer; and removing the resist layer from the semiconductor wafer.

16. A method of manufacturing a semiconductor device, comprising steps of:

designing a mask to form a mask pattern having specific dimensions on a semiconductor wafer;

preparing the mask, said step of preparing the mask comprising (i) a first process of determining a correlation coefficient of a correlation between first pattern dimensions of a pattern formed on a semiconductor wafer and designed pattern dimensions of the pattern, where the pattern and an adjacent pattern maintain a specific pitch, (ii) a second process of determining a first pattern density dependency of the mask pattern on a distance to the nearest neighbor of the semiconductor wafer on the semiconductor wafer, (iii) a third process of obtaining second pattern dimensions and a second pattern density dependency by dividing the first dependency by the correlation coefficient, (iv) a fourth process of dividing the second pattern dimensions and the second pattern density dependency by a mask writing grid width which a mask writing system uses when it prepares a mask by referring to the designed pattern dimensions, and extracting points of the second pattern dimensions and the second pattern density dependency that appear on the mask writing grid, and thereby determining a pattern proximity and a dimensional difference over the designed pattern dimensions, and (v) a fifth process of conducting a correction by use of the mask grid width multiplied by an integer, the mask grid width being the closest to the dimensional difference;

disposing a resist layer on the semiconductor wafer and forming a pattern by use of the prepared mask;

etching the semiconductor wafer; and removing the resist layer from the semiconductor wafer.

* * * * *

UNITED STATES PATENT AND TRADEMARK OFFICE
CERTIFICATE OF CORRECTION

PATENT NO. : 6,136,478
DATED : October 24, 2000
INVENTOR(S) : Satoshi Usui, et. al.

It is certified that error appears in the above-identified patent and that said Letters Patent is hereby corrected as shown below:

On the Title Page, Item [57], in the Abstract, line 16, after "grid", delete "with".
Claim 15, col. 12, line 67, after "comprising", insert --steps of:--.

Signed and Sealed this

Twenty-second Day of May, 2001

*Attest:*

NICHOLAS P. GODICI

*Attesting Officer*     *Acting Director of the United States Patent and Trademark Office*